(12) United States Patent
Fukumitsu (10) Patent No.: US 11,753,296 B2
(45) Date of Patent: Sep. 12, 2023

(54) MEMS DEVICE AND METHOD FOR MANUFACTURING MEMS DEVICE

(71) Applicant: Murata Manufacturing Co., Ltd., Nagaokakyo (JP)

(72) Inventor: Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 333 days.

(21) Appl. No.: 17/009,045

(22) Filed: Sep. 1, 2020

(65) Prior Publication Data

US 2020/0391999 A1    Dec. 17, 2020

Related U.S. Application Data

(63) Continuation of application No. PCT/JP2018/047317, filed on Dec. 21, 2018.

(30) Foreign Application Priority Data

May 24, 2018    (JP) ................................ 2018-099784

(51) Int. Cl.
  *B81B 7/00* (2006.01)
  *B81C 3/00* (2006.01)
  *B81C 1/00* (2006.01)

(52) U.S. Cl.
  CPC ...... *B81C 1/00349* (2013.01); *B81C 1/00325* (2013.01); *B81C 3/001* (2013.01)

(58) Field of Classification Search
  CPC ........................... B81B 7/0032; B81B 7/0041
  See application file for complete search history.

(56) References Cited

U.S. PATENT DOCUMENTS

| | | | |
|---|---|---|---|
| 8,592,285 B2 | 11/2013 | Noda et al. | |
| 10,374,569 B2 | 8/2019 | Umeda et al. | |
| 2012/0306032 A1 | 12/2012 | Noda et al. | |
| 2014/0151821 A1* | 6/2014 | Liang | B81B 3/0021 257/415 |
| 2014/0339659 A1* | 11/2014 | Arai | G01L 19/06 257/419 |

(Continued)

FOREIGN PATENT DOCUMENTS

| | | |
|---|---|---|
| JP | H10324966 A | 12/1998 |
| JP | 5021098 B2 | 9/2012 |

(Continued)

OTHER PUBLICATIONS

International Search Report Issued for PCT/JP2018/047317, dated Mar. 19, 2019.

(Continued)

*Primary Examiner* — Moazzam Hossain
(74) *Attorney, Agent, or Firm* — ArentFox Schiff LLP (57) ABSTRACT

A MEMS device includes a lower substrate having a resonator, an upper substrate disposed to oppose an upper electrode of the resonator, a bonding layer sealing an internal space between the lower substrate and the upper substrate, and wiring layers that contain the same metal material as the bonding layer. Moreover, a rare gas content of each of the wiring layers is less than $1\times10^{20}$ (atoms/cm$^3$).

15 Claims, 10 Drawing Sheets (56) References Cited

U.S. PATENT DOCUMENTS

| | | | |
|---|---|---|---|
| 2016/0197597 A1* | 7/2016 | Yamada | H03H 9/171 29/25.35 |
| 2016/0349202 A1* | 12/2016 | Xu | C23C 14/205 |
| 2017/0174503 A1* | 6/2017 | Lee | B81B 7/007 |
| 2018/0048285 A1 | 2/2018 | Nishimura et al. | |
| 2018/0226937 A1 | 8/2018 | Umeda et al. | |

FOREIGN PATENT DOCUMENTS

| | | | |
|---|---|---|---|
| WO | 2016159018 A1 | 10/2016 | |
| WO | WO-2017047663 A1 * | 3/2017 | B81B 7/0077 |
| WO | 2017090380 A1 | 6/2017 | |

OTHER PUBLICATIONS

Written Opinion of the International Searching Authority issued for PCT/JP2018/047317, dated Mar. 19, 2019.

* cited by examiner

FIG. 4B (STEP4)

(STEP5)

(STEP6)

|  | | SPUTTERING FILM PRODUCT | VAPOR DEPOSITION FILM PRODUCT |
|---|---|---|---|
| PACKAGE INTERNAL PRESSURE | | ≈ 1000 Pa | <10 Pa |
| GAS PARTIAL PRESSURE IN PACKAGE | $N_2$ | 54 (Pa) | DETECTION LIMIT OR LESS |
| | $O_2$ | DETECTION LIMIT OR LESS | DETECTION LIMIT OR LESS |
| | Ar | 1047 (Pa) | DETECTION LIMIT OR LESS |

MEMS DEVICE AND METHOD FOR MANUFACTURING MEMS DEVICE

CROSS REFERENCED TO RELATED APPLICATIONS

The present application is a continuation of PCT/JP2018/047317, filed Dec. 21, 2018, which claims priority to Japanese Patent Application No. 2018-099784, filed May 24, 2018, the entire contents of each of which are incorporated herein by reference.

TECHNICAL FIELD

The present invention relates to a MEMS device and a method for manufacturing a MEMS device.

BACKGROUND

In recent years, devices produced by using MEMS (microelectromechanical systems) technology, which integrates a machine element component, a sensor, an actuator, an electronic circuit, and the like on a silicon substrate, a glass substrate, an organic material, or the like, have become widespread. MEMS devices can be formed by bonding an upper substrate to a lower substrate on which a semiconductor element provided with a multilayer structure is mounted.

For example, Patent Document 1 (identified below) discloses a method for bonding an upper substrate to a lower substrate by using binary eutectic bonding between germanium and aluminum. In the method described in Patent Document 1, an aluminum-containing layer and a germanium layer in a polymerized state are interposed between the bonding surfaces of a first semiconductor substrate and a second semiconductor substrate and eutectic bonding between the first semiconductor substrate and the second semiconductor substrate is performed by subjecting the bonding surfaces to heating and pressurizing treatment.

Patent Document 1: Japanese Patent No. 5021098.

Incidentally, when a MEMS device is produced, a resonator, a bonding layer, a wiring layer, and the like have to be formed on a wafer surface. Regarding the film formation method for forming these layers, a sputtering technique, which is excellent in film adhesiveness, has been used for MEMS device in the related art described in Patent Document 1. According to the sputtering technique, since a film is formed by using a rare gas, for example, Ar (argon), a sputtering gas (e.g., Ar) is sealed in the film. As a result, with respect to MEMS device, there is a concern that the degree of vacuum in the device may be reduced.

SUMMARY OF THE INVENTION

The exemplary embodiments of the present invention have been realized in consideration of such circumstances. Thus, it is an object to suppress the degree of vacuum in a MEMS device from being reduced.

In an exemplary aspect, a MEMS device is provided that includes a lower substrate having a resonator, an upper substrate disposed opposing an upper electrode of the resonator, a bonding layer sealing an internal space between the lower substrate and the upper substrate, and a wiring layer containing the same metal material as the bonding layer. Moreover, the rare gas content of the wiring layer is less than $1 \times 10^{20}$ (atoms/cm$^3$).

According to the exemplary embodiment of the present invention, the degree of vacuum in a MEMS device can be suppressed from being reduced.

DESCRIPTION OF EXEMPLARY EMBODIMENTS

First Exemplary Embodiment

Figure 1:
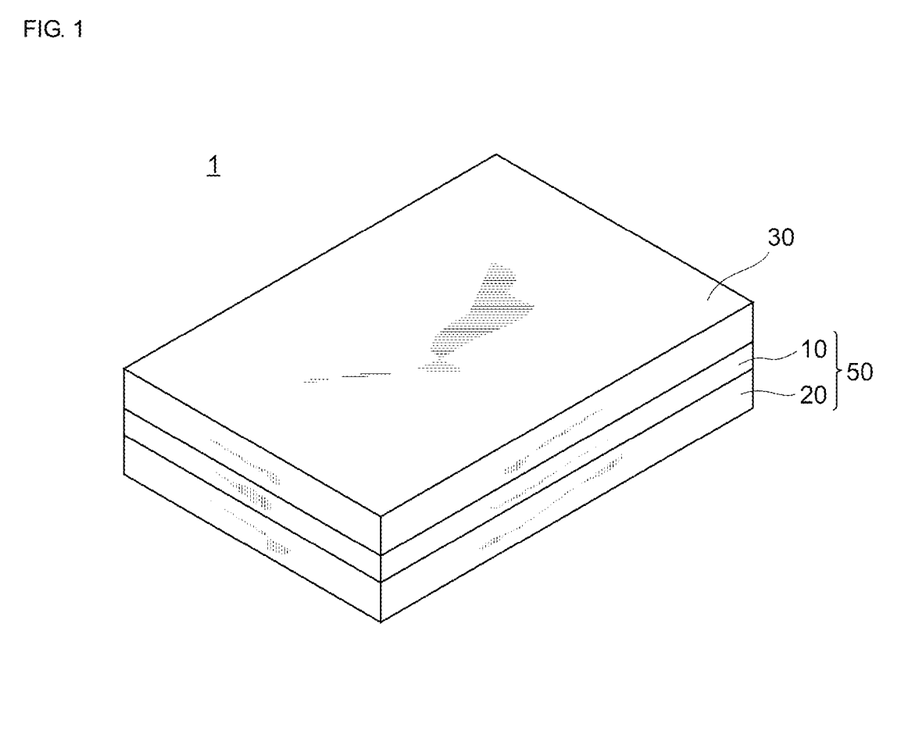
FIG. 1 is a schematic perspective view of the appearance of a resonance unit according to a first exemplary embodiment.
Figure 2:
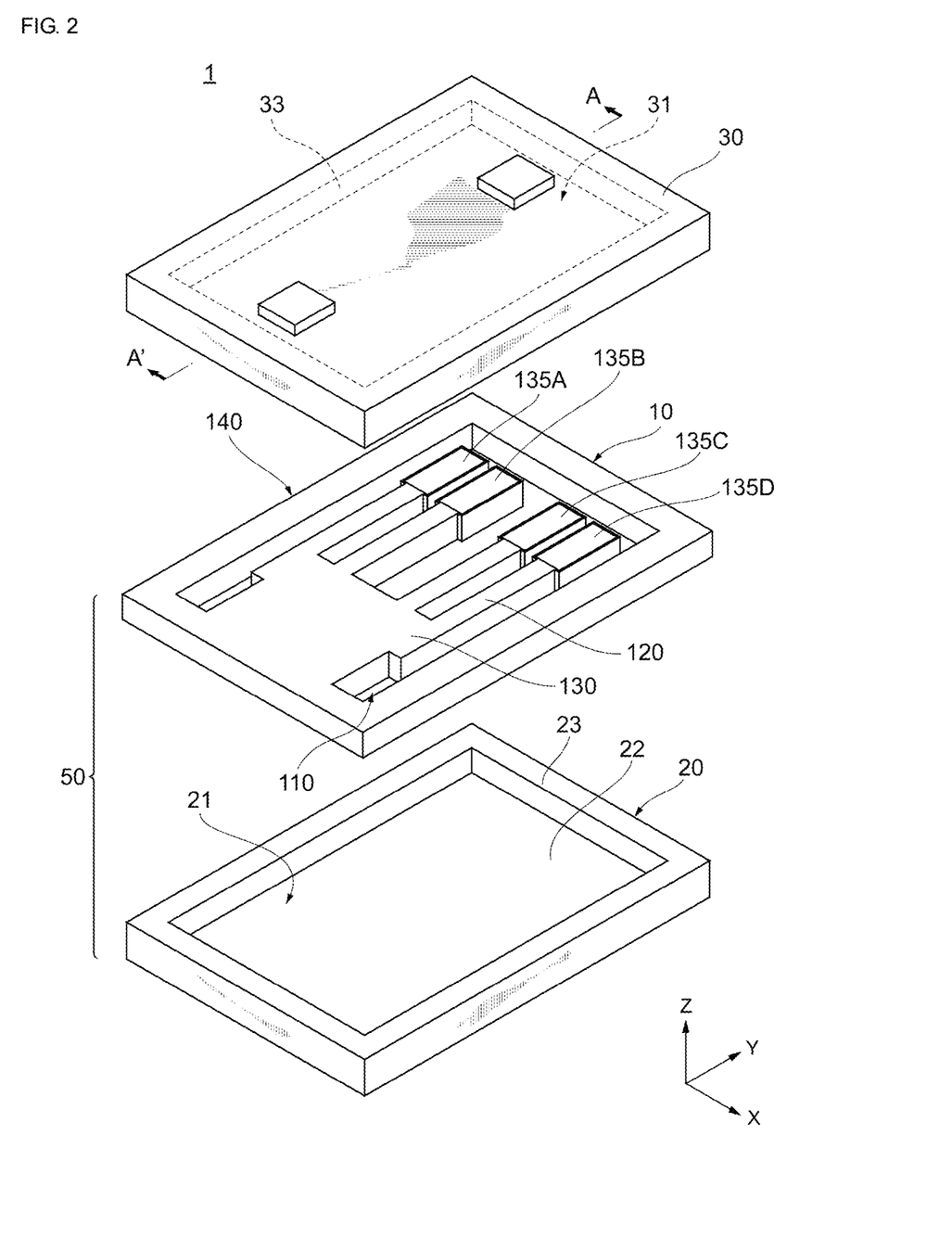
FIG. 2 is a schematic exploded perspective view of the structure of the resonance unit according to the first exemplary embodiment.

A first exemplary embodiment will be described below with reference to the accompanying drawings. FIG. 1 is a schematic perspective view of the appearance of a resonance unit 1 (an example of MEMS device) according to the first exemplary embodiment. FIG. 2 is a schematic exploded perspective view of the structure of the resonance unit 1 according to the first exemplary embodiment.

Outline of Configuration

The resonance unit 1 includes a resonator 10, an upper lid 30 (e.g., an example of an upper substrate), and a lower lid 20 where the upper lid 30 and the lower lid 20 are disposed opposing each other with the resonator 10 interposed therebetween. The resonator 10 and the lower lid 20 can be integrated using a SIO substrate 50 (e.g., an example of the lower substrate). Hereafter, the resonator 10 and the lower lid 20 can be collectively referred to as SOI substrate 50.

Moreover, SOI substrate 50 is bonded to the upper lid 30 so as to seal the resonator 10 and to form a vibration space (i.e., an internal space) of the resonator 10.

Upper Lid 30

The upper lid 30 has a rectangular bottom plate 32 that extends flat in the XY plane and a side wall 33 that extends from a peripheral edge portion of the bottom plate 32 in the Z-direction (that is, stacking direction of the upper lid 30 and the resonator 10). In the portion of the upper lid 30 that opposes the resonator 10, a recessed portion 31 is delimited by the bottom plate 32 and the side wall 33. The recessed portion 31 forms part of a vibration space serving as a space in which the resonator 10 vibrates.

Lower Lid 20

The lower lid 20 has a rectangular flat bottom plate 22 that is disposed in the XY plane and a side wall 23 that extends from a peripheral edge portion of the bottom plate 22 in the Z-direction (that is, stacking direction of the lower lid 20 and the resonator 10). In the portion of the lower lid 20 that opposes the resonator 10, a recessed portion 21 is formed while being delimited by the surface of the bottom plate 22 and the inner surface of the side wall 23. The recessed portion 21 forms part of a vibration space serving as a space in which the resonator 10 vibrates. The vibration space is hermetically sealed by the upper lid 30 and the lower lid 20, and the vacuum state is maintained. Low-pressure inert gas may remain in the vibration space according to the exemplary aspect.

Resonator 10

According to the exemplary embodiment, the resonator 10 is a MEMS resonator that can be produced by using MEMS technology. The resonator 10 includes a vibration portion 120, a holding portion 140, and a holding arm 110. The vibration portion 120 is disposed inside the holding portion 140 and has a base portion 130 and a plurality of vibration arms 135A to 135D (generally referred to as "plurality of vibration arms 135") each having a fixed end connected to the base portion 130 and an open end disposed apart from the base portion 130 and each extending from the fixed end to the open or free end. In the vibration portion 120 according to the present embodiment, two vibration arms, the vibration arms 135A and 135D, are arranged in the outer side portion, and two vibration arms, the vibration arms 135B and 135C, are arranged in the inner side portion in the arrangement direction of the vibration arms 135A to 135D.

The holding portion 140 (also referred to as a frame) is formed into the shape of a rectangular frame in the XY plane. The holding portion 140 is disposed in the XY plane so as to surround the outer side portion of the vibration portion 120 in a plan view thereof. It is noted that the holding portion 140 is not limited to having the shape of a frame provided that the holding portion 140 is disposed so as to surround at least part of the vibration portion 120. For example, the holding portion 140 has to be disposed so as to surround the vibration portion 120, such that the holding portion 140 can hold the vibration portion 120 and can be bonded to the upper lid 30 and the lower lid 20.

The holding arm 110 is disposed inside the holding portion 140. One end (e.g., a first end) of the holding arm 110 is connected to the rear end of the base portion 130, the holding arm 110 extends in the direction apart from the rear end, and the other end (e.g., a second end) is connected to the region of the holding portion 140 opposite to the rear end. In this regard, the shape of the holding arm 110 is not limited to the example illustrated in FIG. 2 and may be configured to have, for example, a pair of symmetrical structures. In this case, for example, a pair of holding arms 110 may be bent a plurality of times and the other ends may be connected to respective regions of the holding portion 140 opposite to a plurality of vibration arms 135 or the respective regions opposite to the outer side vibration arms 135A and 135D.

Multilayer Structure

Figure 3:
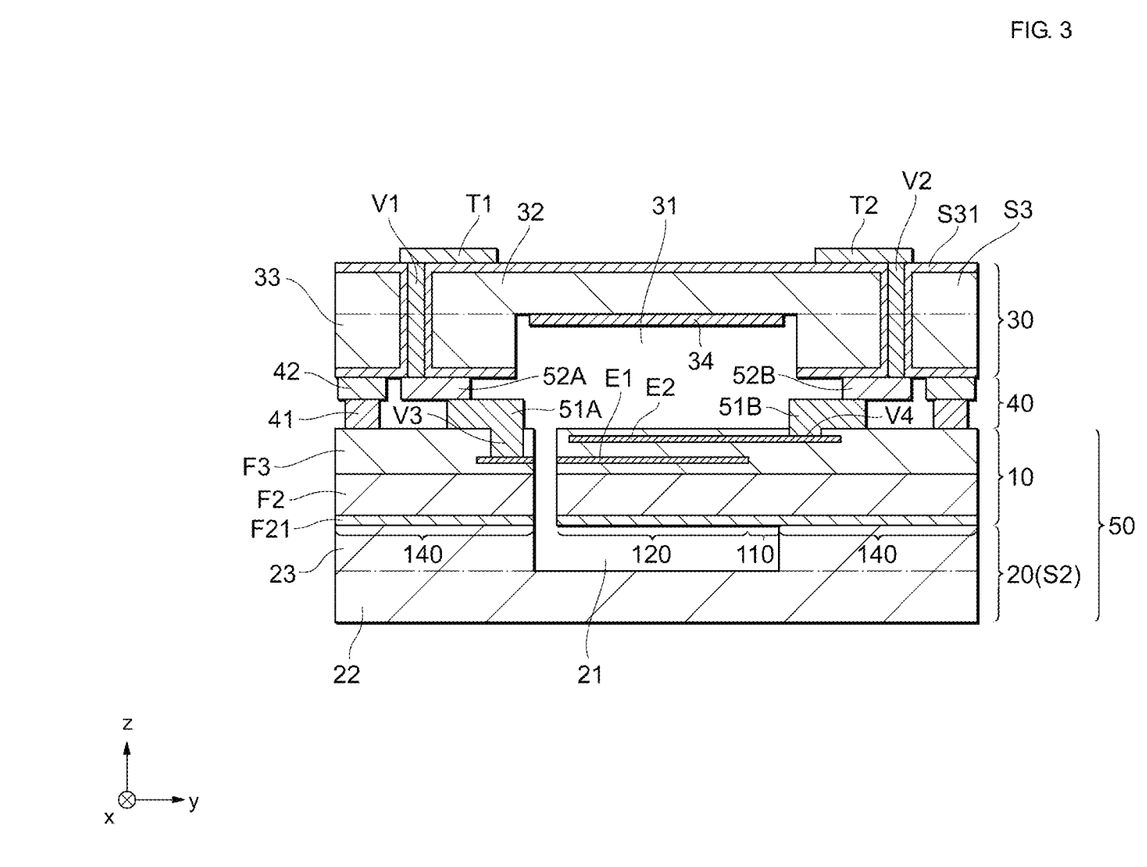
FIG. 3 is a sectional view of the resonance unit cut along line A-A' in FIG. 2.

Next, the multilayer structure of the resonance unit 1 will be described with reference to FIG. 3. FIG. 3 is a schematic diagram illustrating the cross section of the resonance unit 1 cut along line A-A' in FIG. 2.

(2-1. Upper Lid 30)

The bottom plate 32 and the side wall 33 of the upper lid 30 are formed from a Si (silicon) wafer S3 having a predetermined thickness. As illustrated in FIG. 3, the peripheral portion (i.e., side wall 33) of the upper lid 30 is bonded to the holding portion 140 of the resonator 10 by a bonding layer 40 described later. Meanwhile, regarding the upper lid 30 in the example illustrated in FIG. 3, the surface facing the resonator 10 and the surface opposite to the surface facing the resonator 10 are covered with a silicon oxide film S31 in the exemplary aspect. The silicon oxide film S31 is formed on the surface of the Si wafer S3 by, for example, surface oxidation of the Si wafer S3 or chemical vapor deposition (CVD).

In addition, terminals T1 and T2 are disposed on the surface of the upper lid 30 opposite to the surface facing the resonator 10. The terminals T1 and T2 are electrically coupled to the resonator 10 via respective through holes (i.e., vias V1 and V2) formed in the upper lid 30. The vias V1 and V2 are filled with a conductive material, for example, polycrystalline silicon (Poly-Si) doped with an impurity, Cu (copper), Au (gold), or single crystal silicon doped with an impurity. The terminals T1 and T2 correspond to external terminals for electrically coupling the resonance unit 1 to an external circuit board or the like and are electrically coupled to the wiring line in MEMS device 1 for electrically coupling the resonator 10 to an external power supply. In this regard, the terminals T1 and T2 may be disposed on the surface of the lower lid 20 or on the surface of the side surface of the lower lid 20 or the upper lid 30.

Moreover, a getter layer 34 is disposed on the surface of the recessed portion 31 of the upper substrate 30 that oppose the resonator 10. The getter layer 34 is formed of an easy-to-oxidize material, for example, Ti (titanium) or Zr (zirconium), and attracts out gas generated in the vibration space defined by the upper lid 30 and the lower lid 20. Regarding the upper lid 30 according to the present embodiment, since the getter layer 34 is disposed on almost the entire surface of the recessed portion 31 opposing the resonator 10, the out gas can be sufficiently attracted, and the vibration space can be maintained in a vacuum.

(2-2. SOI Substrate 50)

The bottom plate 22 and the side wall 23 of the lower lid 20 are integrally formed from a Si (silicon) wafer S2 according to the exemplary aspect. The lower lid 20 is bonded to the holding portion 140 of the resonator 10 with the upper surface of the side wall 23. The thickness of the lower lid 20 in the Z-axis direction is set to be, for example, 150 μm, and the depth of the recessed portion 21 is set to be, for example, about 50 μm. In this regard, the Si wafer S2 is formed of nondegenerate silicon and the resistivity thereof is, for example, 16 mΩ·cm or more.

In the resonator 10, the holding portion 140, the base portion 130, the plurality of vibration arms 135, and the holding arm 110 are integrally formed in the same process. In the resonator 10, a metal layer E1 (an example of a lower electrode) is stacked on a Si (silicon) substrate F2. A piezoelectric thin film F3 (an example of a piezoelectric film) is stacked on the metal layer E1 so as to cover the metal layer E1. Further, a metal layer E2 is stacked on the surface of the piezoelectric thin film F3. A protective film (piezoelectric thin film F3 in the example illustrated in FIG. 3) is stacked on the metal layer E2 so as to cover the metal layer E2.

The Si substrate F2 is formed of a degenerate n-type Si semiconductor having a thickness of, for example, about 6 μm and may contain P (phosphorus), As (arsenic), Sb (antimony), or the like as an n-type dopant. The resistance value of degenerate Si used for the Si substrate F2 is, for example, less than 1.6 mΩ·cm and more preferably 1.2 mΩ·cm or less. Moreover, a silicon oxide (for example, $SiO_2$) layer F21 corresponding to a temperature characteristics compensation layer is further disposed on the lower surface of the Si substrate F2. Consequently, the temperature characteristics can be improved.

In the present embodiment, the temperature characteristics compensation layer is configured to provide a function of reducing the temperature coefficient (that is, rate of change per temperature) of frequency in the vibration portion 120 at least in the vicinity of ambient temperature. The vibration portion 120 including the silicon oxide layer F21 corresponding to the temperature characteristics compensation layer enables changes with temperature of the resonant frequency of the multilayer structure composed of, for example, the Si substrate F2, the metal layers E1 and E2, the piezoelectric thin film F3, and the silicon oxide layer F21 to be reduced.

In the resonator 10, the silicon oxide layer F21 is preferably formed so as to have a uniform thickness. For purposes of this disclosure of the exemplary embodiment, the term "uniform thickness" denotes variations in the thickness of the silicon oxide layer F21 being within ±20% from the average value of the thickness.

The silicon oxide layer F21 may be disposed on the upper surface of the Si substrate F2 or may be disposed on both the upper surface and the lower surface of the Si substrate F2. Meanwhile, in the holding portion 140, the silicon oxide layer F21 is not limited to being disposed on the lower surface of the Si substrate F2.

The metal layers E2 and E1 are formed by using Mo (molybdenum), Al (aluminum), or the like having a thickness of, for example, about 0.1 to 0.2 µm. The metal layers E2 and E1 are formed into predetermined shapes by etching or the like. For example, in the vibration portion 120, the metal layer E1 is a lower electrode formed so as to function as an application electrode to which a voltage is applied, a floating electrode electrically isolated from other electrodes, or a ground electrode shunted to ground. In the present example, the lower electrode is a floating electrode. Meanwhile, the metal layer E1 is configured to function as a lower wiring line for electrically coupling the lower electrode (e.g., application electrode or ground electrode) to the terminal T1 in the holding arm 110 or the holding portion 140.

On the other hand, the metal layer E2 is formed so as to function as the upper electrode in the vibration portion 120. The metal layer E2 is configured to function as an upper wiring line for electrically coupling the upper electrode to the terminal T2 in the holding arm 110 or the holding portion 140.

The piezoelectric thin film F3 is a piezoelectric body thin film which converts an applied voltage to vibration and may contain a nitride, for example, AlN (aluminum nitride), or an oxide as a primary component. Specifically, the piezoelectric thin film F3 may be formed of ScAlN (scandium aluminum nitride). Regarding ScAlN, some of the aluminum in aluminum nitride is substituted with scandium. The thickness of the piezoelectric thin film F3 is, for example, about 1 µm and may be about 0.2 µm to 2 µm.

The piezoelectric thin film F3 expands and contracts in the in-plane direction of the XY plane, that is, the Y-axis direction, in accordance with the electric field applied by the metal layers E1 and E2 to the piezoelectric thin film F3. The open ends of the plurality of vibration arms 135 are displaced toward the inner surface of the lower lid 20 or the upper lid 30 due to the expansion and contraction of the piezoelectric thin film F3 and vibrate in an out-of-plane bending vibration mode.

In the present embodiment, the phase of the electric field applied to the outer side vibration arms 135A and 135D and the phase of the electric field applied to the inner vibration arms 135B and 135C are set to be opposite to each other. Consequently, the outer side vibration arms 135A and 135D are displaced in the direction opposite to the displacement direction of the inner side vibration arms 135B and 135C. For example, when the open ends of the outer side vibration arms 135A and 135D are displaced toward the inner surface of the upper lid 30, the open ends of the inner side vibration arms 135B and 135C are displaced toward the inner surface of the lower lid 20.

In the present embodiment, regarding the resonator 10 having four vibration arms 135A to 135D where the main vibration is in the out-of-plane bending vibration mode, the upper electrode E2 is divided, and each part is electrically coupled to an alternating-current power supply. A voltage having a phase opposite to the phase of the voltage applied to the upper electrode E2 of the inner side vibration arms 135B and 135C is applied to the upper electrode E2 of the outer side vibration arms 135A and 135D. Consequently, in the configuration according to the present embodiment, the direction of the bending vibration of the inner side vibration arms 135B and 135C and that of the outer side vibration arms 135A and 135D are opposite to each other, but the configuration of the resonator 10 is not limited to this. It is also noted that the resonator according to the exemplary embodiment may have, for example, a configuration of a single vibration arm or a configuration in which vibration is performed in an in-plane bending vibration mode. Further, the resonator 10 is not limited to being a resonator using the bending vibration mode and may be a resonator using a thickness longitudinal vibration mode, a Lamb wave vibration mode, or a surface acoustic wave vibration mode. These are applied to timing devices, RF filters, duplexers, and ultrasonic transducers. Further, these may be used for piezoelectric mirrors and piezoelectric gyros having an actuator function, piezoelectric microphones and ultrasonic vibration sensors having a pressure sensor function, and the like. Meanwhile, the resonator 10 may be an electrostatic MEMS including no piezoelectric thin film F3.

(2-3. Bonding Layer and Wiring Layer)

The upper lid 30 is bonded to the resonator 10 with the bonding layer 40 interposed therebetween. The bonding layer 40 is composed of two layers (first layer 41 and second layer 42). The first layer 41 is disposed on the resonator 10. The first layer 41 is a layer in which an Al film, a Ti film, and an Al film are disposed in this order on a protective layer of the surface of the resonator 10. The first layer 41 is not limited to having this configuration and may be, for example, a single layer of an Al film, a layer composed of a Ti film and an Al film, a layer composed of a Ta film and an Al film, or a layer in which an Al film, a Ta film, and an Al film are disposed in this order. In this regard, the Al film is a film containing Al as a primary component and may contain AlCu, AlSiCu, or the like.

Meanwhile, the second layer 42 is disposed on the upper lid 30. The second layer 42 is a layer in which an Al film, a Ti film, and a Ge film are disposed in this order on the surface of the Si wafer S3 of the upper lid 30. The second layer 42 is not limited to having this configuration and may be, for example, a layer composed of a Ti film and a Ge film, a layer composed of a Ta film and a Ge film, or a layer in which an Al film, a Ta film, and a Ge film are disposed in this order. In this regard, the Al film is a film containing Al as a primary component and may contain AlCu, AlSiCu, or the like.

In FIG. 3, the first layer 41 and the second layer 42 are illustrated as layers independent of each other. However, according to the exemplary aspect, the bonding layer 40 is integrally formed by eutectic bonding between the Al film in the first layer 41 and the Ge film in the second layer 42.

Further, the terminals T1 and T2 of the upper lid 30 are electrically coupled to the metal layers E1 and E2 of the resonator 10 with wiring layers (e.g., first wiring layers 51A and 51B, respectively, and second wiring layers 52A and 52B, respectively) interposed therebetween. The first wiring layers 51A and 51B are composed of the same film as the first layer 41, and the second wiring layers 52A and 52B are composed of the same film as the second layer 42. Consequently, the process can be simplified. The first wiring layers 51A and 51B and the second wiring layers 52A and 52B are disposed in the bonding layer 40, that is, in the vibration space.

In particular, in the holding portion 140, the first wiring layer 51A is electrically coupled to the metal layer E1 through a via V3 formed by removing the protective film, the metal layer E2, and the piezoelectric thin film F3 until the metal layer E1 is exposed. In the holding portion 140, the first wiring layer 51B is electrically coupled to the metal layer E2 through a via V4 formed by removing the protective film until the metal layer E2 is exposed. In FIG. 3, the vias V3 and V4 are filled with the first wiring layers 51A and 51B, respectively, but actually, metal films are formed along the side walls of the vias V3 and V4 in the exemplary aspect. The metal films formed in the vias V3 and V4 are preferably the same metal materials as for the first wiring layers 51A and 51B, respectively. Meanwhile, the second wiring layer 52A is formed so as to electrically couple the first wiring layer 51A to the terminal T1, and the second wiring layer 52B is formed so as to electrically couple the first wiring layer 51B to the terminal T2.

Regarding the wiring layers, the first wiring layers 51A and 51B illustrated in FIG. 3 are layers independent of the second wiring layers 52A and 52B, respectively. However, actually, eutectic bonding is performed between part of the first wiring layer 51A and part of the second wiring layer 52A and between part of the first wiring layer 51B and part of the second wiring layer 52B. That is, each of the first wiring layer 51A and the second wiring layer 52A or each of the first wiring layer 51B and the second wiring layer 52B has a eutectic portion in which eutectic bonding is performed between the two in the vicinity of the contact area and a non-eutectic portion which is a region apart from the contact area and in which the two are independent of each other without eutectic bonding being performed.

According to the exemplary embodiment, the rare gas content of each of the first wiring layers 51A and 51B and the second wiring layers 52A and 52B is more than 0 (atoms/cm$^3$) and less than $1 \times 10^{20}$ (atoms/cm$^3$) as described later in detail. In this regard, the rare gas content of each of the first wiring layers 51A and 51B and the second wiring layers 52A and 52B is equal to a rare gas content measured with respect to, for example, the non-eutectic portion. Alternatively, for example, in each of the first wiring layers 51A and 51B and the second wiring layers 52A and 52B, the numerical value of the portion having a high rare gas content may be taken as the rare gas content of each of the first wiring layers 51A and 51B and the second wiring layers 52A and 52B. According to exemplary aspects, the rare gas (also referred to as a noble gas) is a gas used for film formation and is, for example, Ar (argon), Kr (krypton), He (helium), Ne (neon), or Xe (xenon).

Process Flow

Figure 4A:
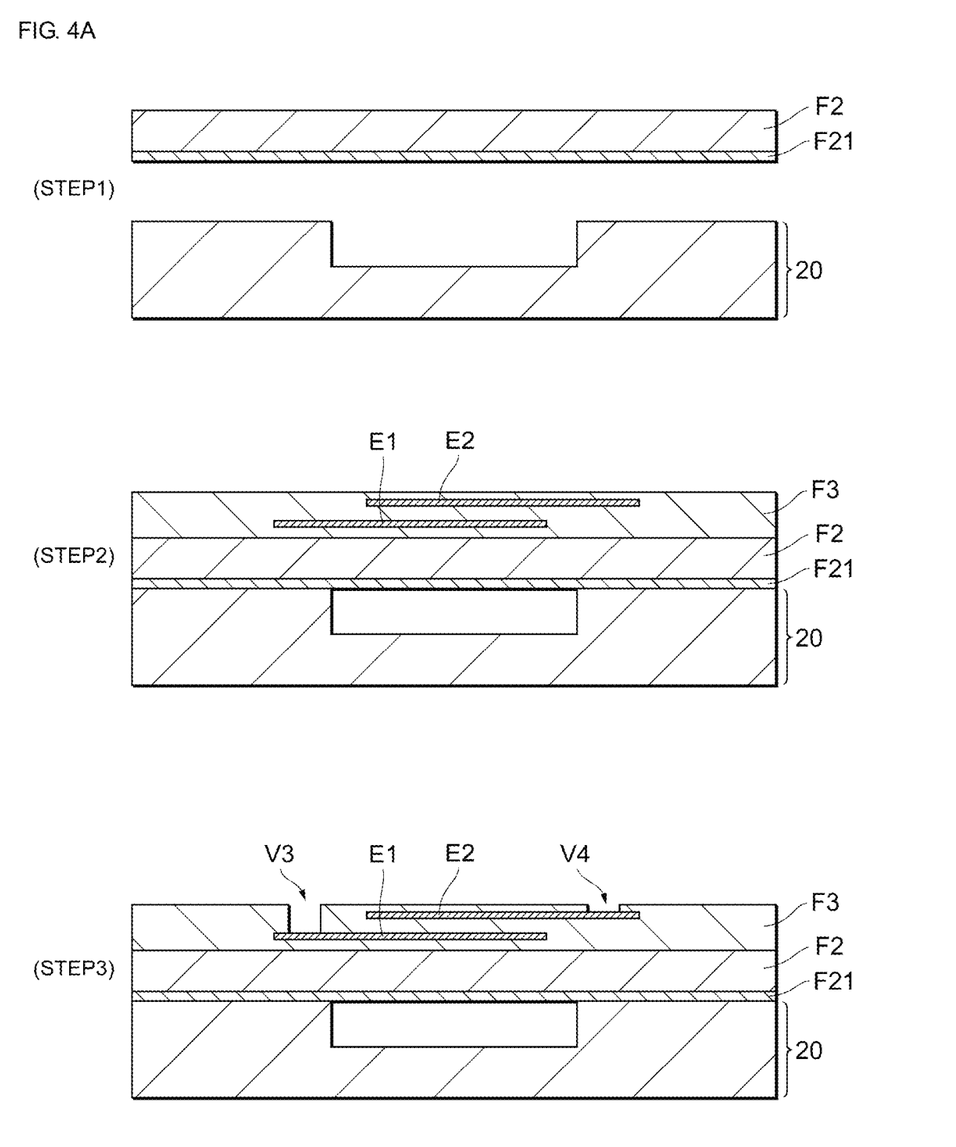
FIG. 4A is a diagram illustrating an example of the process flow of the resonance unit according to the first exemplary embodiment.
Figure 4B:
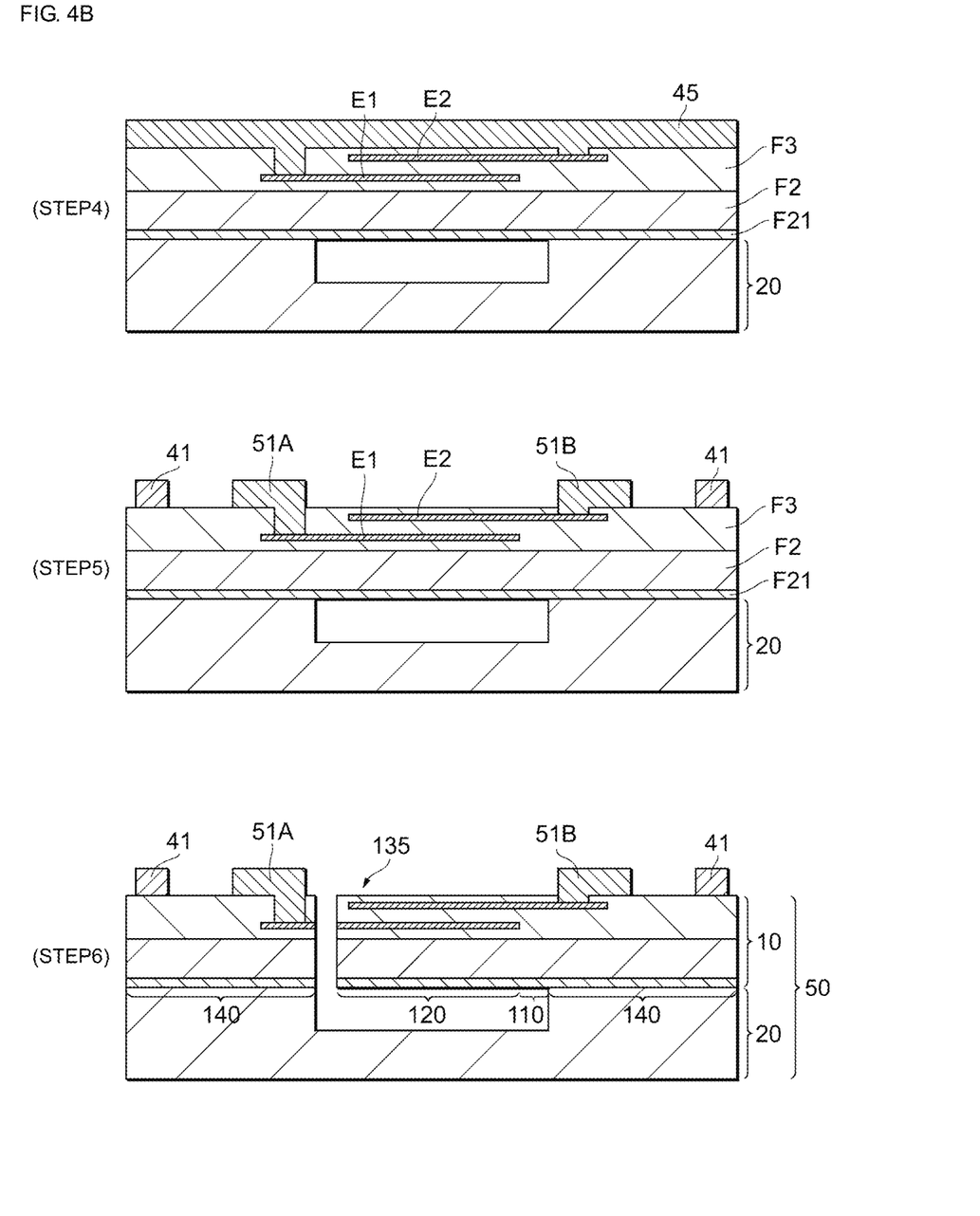
FIG. 4B is a diagram illustrating an example of the process flow of the resonance unit according to the first exemplary embodiment.
Figure 4C:
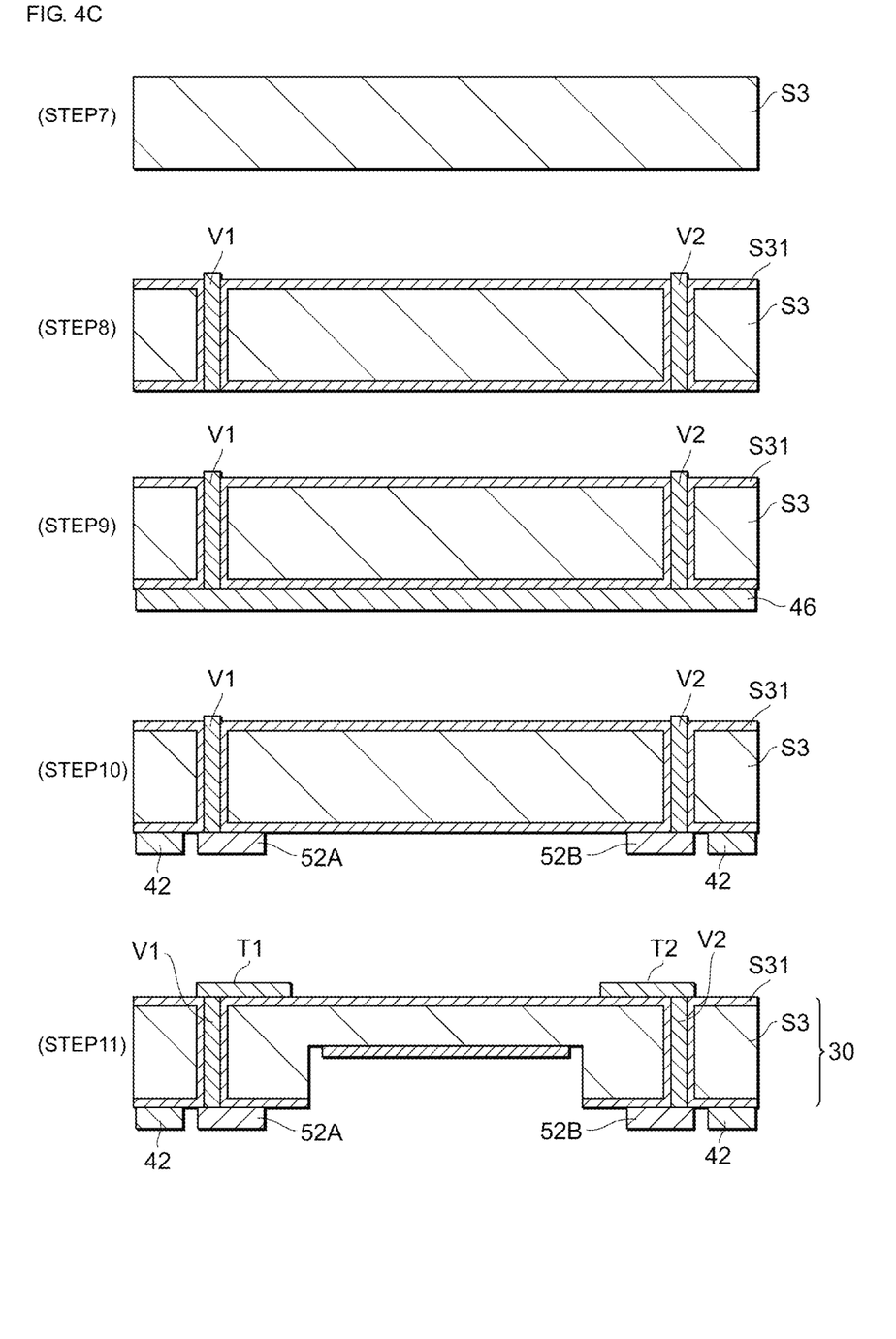
FIG. 4C is a diagram illustrating an example of the process flow of the resonance unit according to the first exemplary embodiment.

Next, the process flow of the resonance unit 1 will be described with reference to FIG. 4A to FIG. 4C. Each of FIG. 4A to FIG. 4C illustrates multiple steps of the process flow of the cross section of the resonance unit 1 cut along line A-A' in FIG. 2. Regarding FIG. 4A to FIG. 4C, for the sake of convenience, one resonance unit 1 of a plurality of resonance units 1 formed on a wafer will be illustrated. However, it is noted that the resonance unit 1 is obtained by forming a plurality of resonance units 1 on the wafer and thereafter dividing the resulting wafer, as in a common MEMS process, according to an exemplary aspect.

In the first step, a lower lid 20 in which a cavity is formed in handle Si (Si wafer S2) by etching is prepared. A separately prepared Si substrate F2 provided with a silicon oxide layer F21 is heat-bonded to the lower lid 20 (STEP 1). Subsequently, a metal layer E1 is formed on the Si substrate F2, and the metal layer E1 is patterned into a lower electrode in a vibration portion 120 and into a lower wiring line in a holding portion 140 and a holding arm 110 by etching or the like. A piezoelectric thin film F3 and a metal layer E2 are formed in this order on the patterned metal layer E1. Thereafter, the metal layer E2 is patterned into an upper electrode in the vibration portion 120 and into an upper wiring line in the holding portion 140 and the holding arm 110 by etching or the like. Further, the piezoelectric thin film F3 is formed as a protective layer above the patterned metal layer E2 (STEP 2). In this regard, a seed layer may be formed between the metal layer E1 and the Si substrate F2. The seed layer is, for example, an aluminum nitride layer. In this case, the crystallinity of the piezoelectric thin film F3 formed on the metal layer E1 can be improved.

In STEP 3 that follows, a via V3 is formed by removing part of each of the piezoelectric thin film F3, the metal layer E2, and the piezoelectric thin film F3 by etching or the like. Likewise, a via V4 is formed by removing part of the piezoelectric thin film F3 by etching or the like (STEP 3).

A metal layer 45 is formed by using a vapor deposition method so as to cover the resulting vias V3 and V4 (STEP 4). The metal layer 45 is a layer in which, for example, an Al film, a Ti film, and an Al film are stacked in this order. Regarding the vacuum vapor deposition condition at this time, it is preferable that evacuation be performed and that the degree of vacuum in a vacuum vapor deposition apparatus used for vapor deposition be set to be $1 \times 10^{-3}$ Pa or less, for example. In the present embodiment, evacuation is performed so that the degree of vacuum is set to be $1 \times 10^{-4}$ Pa or less, and, thereafter each film (Al, Ti, and Al) of the metal layer 45 is vacuum evaporated. Consequently, the rare gas content of the metal layer 45 is set to be more than 0 (atoms/cm$^3$) and less than $1 \times 10^{20}$ (atoms/cm$^3$). The metal layer 45 is patterned into first wiring layers 51A and 51B and a first layer 41 by etching or the like (STEP 5).

Thereafter, a vibration portion 120, a holding arm 110, and a holding portion 140 are formed by removing part of each of the protective layer (piezoelectric thin film F3), the metal layer E2, the piezoelectric thin film F3, the metal layer E1, the Si substrate F2, and the silicon oxide layer F21 successively by processing such as etching so as to form a resonator 10 (STEP 6).

Subsequently, a Si wafer S3 of an upper lid 30 is prepared (STEP 7). Through holes (vias V1 and V2) are formed in the Si wafer S3 by etching or the like. Further, a silicon oxide film S31 is formed on the surface of the Si wafer S3, and the vias V1 and V2 are filled with a conductor such as a metal material (STEP 8). A metal layer 46 is formed on one surface of the upper lid 30 provided with the silicon oxide film S31 by using a vapor deposition method (STEP 9). The metal layer 46 is a layer in which, for example, an Al film, a Ti film, and a Ge film are stacked in this order. Regarding the vacuum vapor deposition condition at this time, it is preferable that evacuation be performed and that the degree of vacuum in a vacuum vapor deposition apparatus used for vapor deposition be set to be $1\times10^{-3}$ Pa or less. In the present embodiment, evacuation is performed so that the degree of vacuum is set to be $1\times10^{-4}$ Pa or less, and, thereafter each film (Al, Ti, and Ge) of the metal layer 46 is vacuum evaporated. The metal layer 46 is patterned into second wiring layers 52A and 52B and a second layer 42 by etching or the like (STEP 10). Thereafter, a cavity is formed by etching the upper lid 30 from the same surface as the surface provided with the second wiring layers 52A and 52B and the second layer 42, and a getter layer 34 is formed inside the cavity. Terminals T1 and T2 are formed on the surface opposite to the surface provided with the second wiring layers 52A and 52B and the second layer 42 so as to cover the vias V1 and V2 (STEP 11). In this regard, the vias V1 and V2 may be filled with a conductor in STEP 11.

Figure 4D:
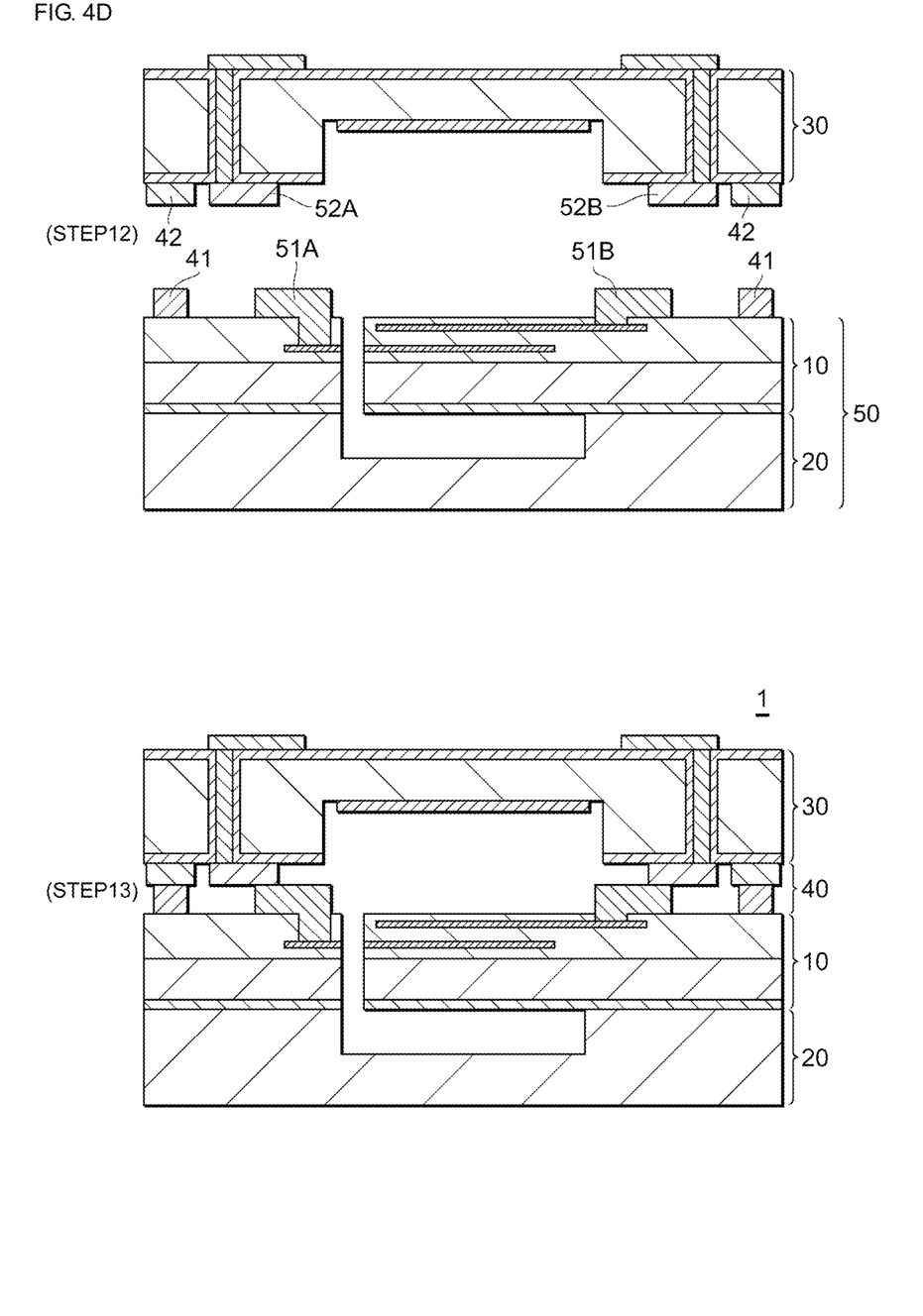
FIG. 4D is a diagram illustrating an example of the process flow of the resonance unit according to the first exemplary embodiment.

The surface provided with the second wiring layers 52A and 52B and the second layer 42 of the upper lid 30 on which the terminals T1 and T2 are formed in STEP 11 is made to face the surface provided with the resonator 10 of the lower substrate 50 (STEP 12). The lower lid 20 and the resonator 10 are bonded to the upper lid 30, and eutectic bonding is performed by heat treatment (STEP 13). At this time, eutectic bonding between the first layer 41 and the second layer 42 is caused by performing heat treatment at a high temperature of about 420° C. or higher and 440° C. or lower. Consequently, a vibration space is sealed in the resonance unit 1. Thereafter, a plurality of resonance units 1 are formed by cutting with a dicing machine.

Experimental Result

The experimental results of examination of the degree of vacuum in the resonance unit 1 according to the present embodiment will be described with reference to FIGS. 5(A), 5(B), 6(A), 6(B) and FIG. 7. Regarding the experiment, the results of examination in the case in which the first layer 41 and the second layer 42 of the bonding layer 40 were made by using a sputtering method in the related art (FIG. 5(A) and FIG. 5(B)) or by using the vapor deposition method under the above-described vacuum vapor deposition condition (FIG. 6(A) and FIG. 6(B)) are described. In each case, the first wiring layers 51A and 51B are formed by the same process as for the first layer 41 of the bonding layer 40, and the second wiring layers 52A and 52B are formed by the same process as for the second layer 42.

Figure 5A:
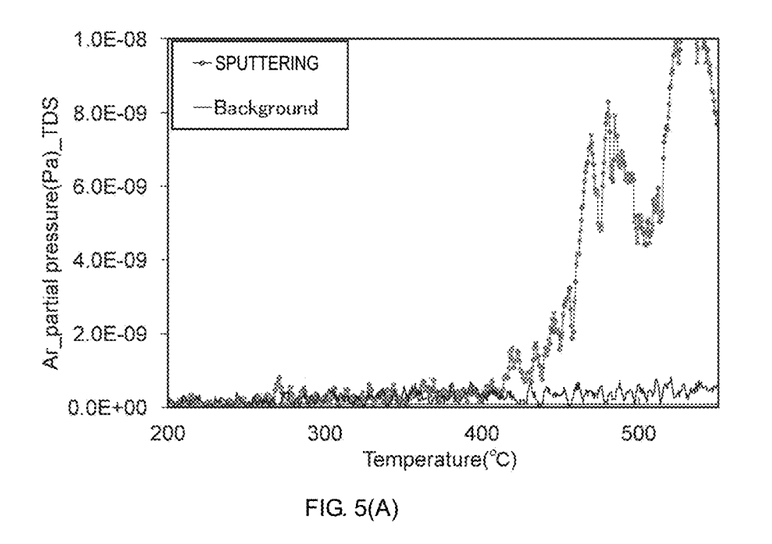
FIGS. 5(A) and 5(B) illustrate graphs showing the experimental results of examining the degree of vacuum of the resonance unit according to the first exemplary embodiment.
Figure 5B:
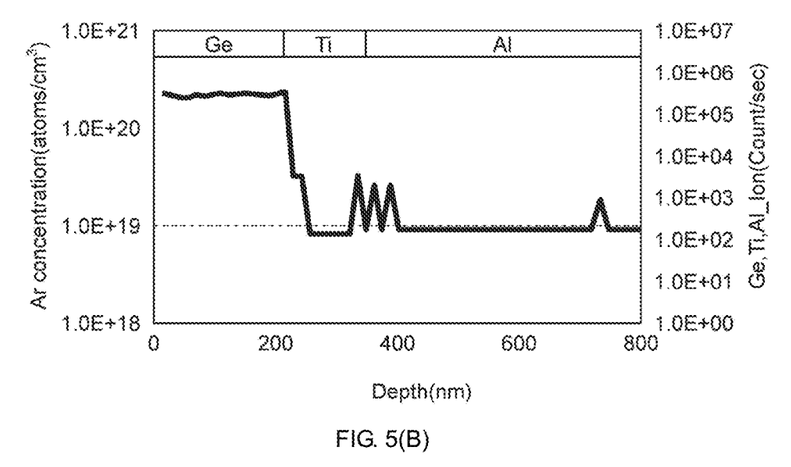
Figure 6A:
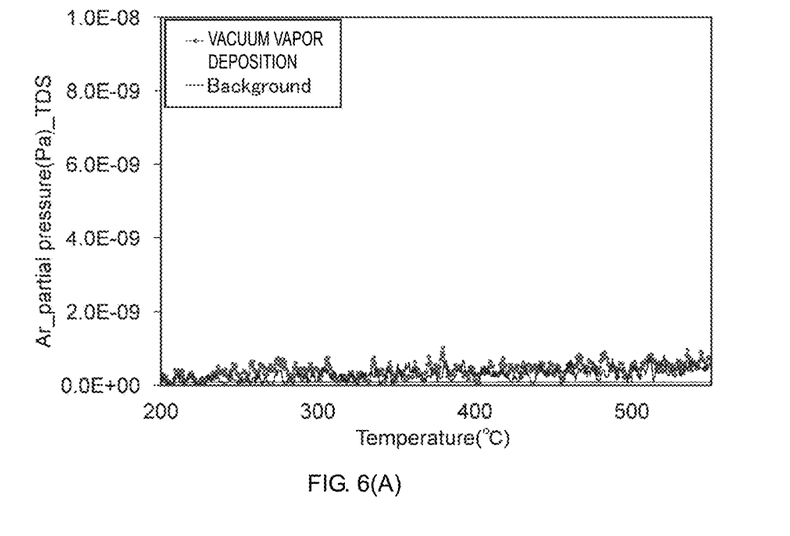
FIGS. 6(A) and 6(B) illustrate graphs showing the experimental results of examining the degree of vacuum of the resonance unit according to the first exemplary embodiment.
Figure 6B:
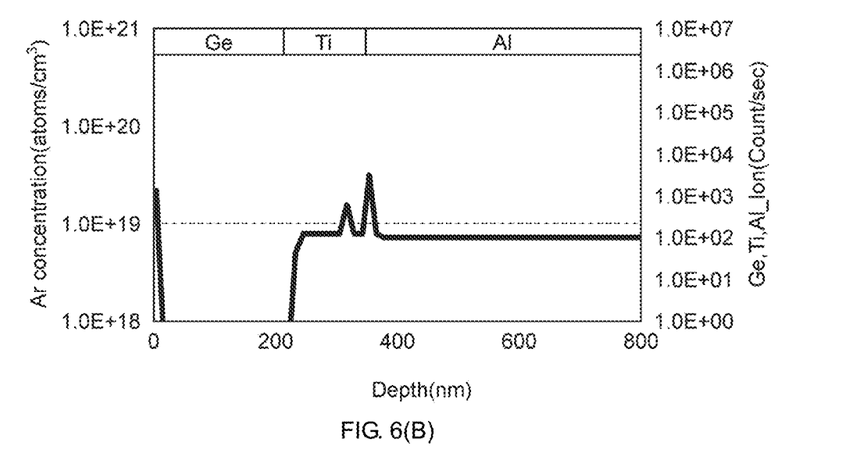

Each of FIG. 5(B) and FIG. 6(B) illustrates the amount of rare gas (Ar gas in the present experimental example) sealed in each film (Ge film, Ti film, or Al film) of the second layer 42 with respect to the respective film formation methods. FIG. 5(B) is a graph of the case in which the sputtering method was used, and FIG. 6(B) is a graph of the case in which the vapor deposition method was used under the above-described vacuum vapor deposition condition. The horizontal axis represents the depth of the film at which the amount of Ar gas was measured, and the vertical axis represents the amount of Ar gas sealed at the depth concerned. Dynamic SIMS was used for analyzing the amount of Ar gas sealed. As is clear from the graph in FIG. 5(B), in the case in which the sputtering method was used, a large amount of Ar gas ($1\times10^{20}$ (atoms/cm$^3$) or more) was sealed in the Ge film compared with the Al film and the Ti film. On the other hand, it is ascertained from the graph in FIG. 6(B) that, in the case of the vapor deposition method, Ar gas was hardly present in any film of the second layer 42 and that the rare gas content was less than $1\times10^{20}$ (atoms/cm$^3$).

Each of FIG. 5(A) and FIG. 6(A) illustrates the relationship between the temperature given to the second layer 42 by the heat treatment and the amount of rare gas (Ar gas in the present experimental example) generated with respect to the respective film formation methods. In the graph of each of FIG. 5(A) and FIG. 6(A), the horizontal axis represents the temperature, and the vertical axis represents the amount of Ar gas generated. In this regard, a TDS analysis method was used for measuring the amount of Ar gas generated. FIG. 5(A) is a graph of the case in which the sputtering method was used, and FIG. 6(A) is a graph of the case in which the vapor deposition method was used under the above-described vacuum vapor deposition condition. It is ascertained from the graph in FIG. 5(A) that a large amount of Ar gas was released when heat of 420° C. or higher, that is, a eutectic reaction temperature or higher, was applied to the second layer 42. The reason for this is likely that the second layer 42 was liquefied and fluidized in accordance with a eutectic reaction between Al and Ge of the second layer 42 (Al/Ti/Ge) and sputtering gas such as Ar gas sealed in the second layer 42 was released to the outside. On the other hand, it is ascertained from the graph in FIG. 6(A) that, in the case of the vapor deposition method, Ar gas was hardly released even when heat of the eutectic reaction temperature or higher was applied to the first layer 41 and the second layer 42. That is, it is clear that performing vacuum vapor deposition in a high vacuum enables the rare gas which reduces the degree of vacuum to be suppressed from being sealed in the film.

Figure 7:
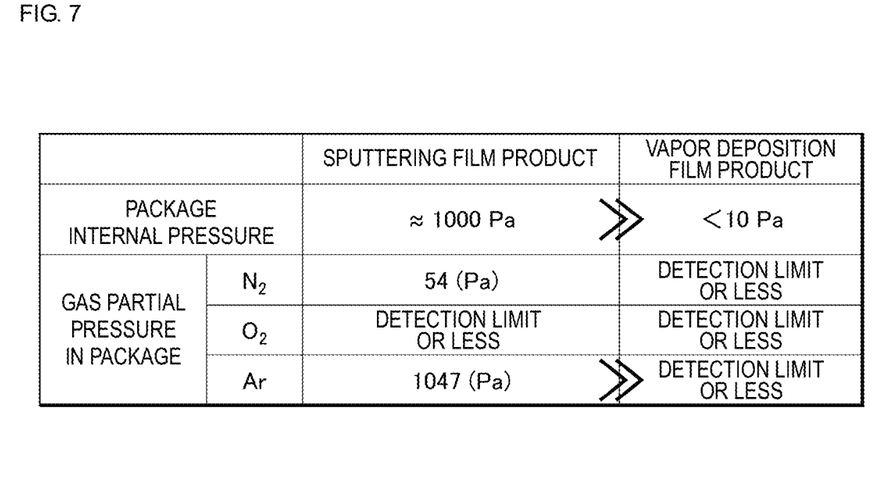
FIG. 7 is a table illustrating the experimental results of examining the degree of vacuum of the resonance unit according to the first exemplary embodiment.

FIG. 7 is a table showing the results of measuring the internal pressure and the gas partial pressure inside a package with respect to each of a resonance unit (sputtering film product) in which the first layer 41 and the second layer 42 were formed by using the sputtering method and a resonance unit (vapor deposition film product) in which the first layer 41 and the second layer 42 were formed by using the vapor deposition method. In this regard, the package internal pressure was derived from resonance characteristics of the MEMS incorporated in the vacuum package. The gas partial pressure in the package was derived by measuring and analyzing the gas released when the vacuum package was broken.

As is clear from the table in FIG. 7, in the case of the sputtering film product, the package internal pressure was about 1,000 Pa and the degree of vacuum was reduced, whereas, in the case of the vapor deposition film product, the internal pressure was lower than 10 Pa and the degree of vacuum was maintained. Regarding the gas partial pressure of the sputtering film product, Ar was 1,047 Pa, which was the highest, N$_2$ was 54 Pa, and O$_2$ was at a detection limit or less. Consequently, it is clear that, regarding the sputtering film product, the sputtering gas (Ar gas) used for sputtering caused a reduction in the degree of vacuum.

As described above, regarding the resonance unit 1 according to the present embodiment, the resonance unit in which the first layer 41 and the second layer 42 of the bonding layer 40 are disposed being vacuum evaporated in a high vacuum enables the rare gas which reduces the degree of vacuum to be suppressed from being sealed in the film.

The exemplary embodiment according to the present invention is as described below. MEMS device 1 according to an embodiment of the present invention includes the lower substrate 50 having the resonator 10, the upper substrate 30 disposed opposing the upper electrode E2 of the resonator 10, the bonding layer 40 sealing the internal space between the lower substrate 50 and the upper substrate 30, and wiring layers 51A, 51B, 52A, and 52B containing the same metal material as the bonding layer 40. Moreover, the rare gas content of each of the wiring layers 51A, 51B, 52A, and 52B is less than $1\times10^{20}$ (atoms/cm$^3$). Consequently, the rare gas can be suppressed from being generated from the wiring layers 51A, 51B, 52A, and 52B and the bonding layer 40 made into the films. As a result, the degree of vacuum in the vibration space of the resonance unit 1 can be suppressed from being reduced.

Preferably, the resonator 10 includes the lower electrode E1, the upper electrode E2, and the piezoelectric film F3 disposed between the lower electrode E1 and the upper electrode E2, the upper substrate 30 has external terminals T1 and T2, and the wiring layers 51A, 51B, 52A, and 52B electrically couple the lower electrode E1 and the upper electrode E2 to the external terminals T1 and T2, respectively.

Preferably, each of the wiring layers 51A, 51B, 52A, and 52B includes an Al layer and a Ge layer. Preferably, the bonding layer 40 bonds the lower substrate 50 to the upper substrate 30 by using a eutectic reaction between an Al-containing layer and a Ge-containing layer. Consequently, the process can be simplified by using the same material for the wiring layers 51A, 51B, 52A, and 52B and the bonding layer 40.

A method for manufacturing MEMS device according to an exemplary embodiment includes preparing the lower substrate 50 having the resonator 10, preparing the upper substrate 30, forming the first metal layer 41 having the first component on the lower substrate 50 by using a vapor deposition method under a predetermined vacuum vapor deposition condition, forming the second metal layer 42 having the second component on the upper substrate 30 by using the vapor deposition method under the vacuum vapor deposition condition, setting the lower substrate 50 and the upper substrate 30 to oppose each other so as to bring the first metal layer 41 and the second metal layer 42 into contact with each other, and heating the lower substrate 50 and the upper substrate 30 at a temperature higher than or equal to the eutectic temperature of the first component and the second component. Consequently, the rare gas can be suppressed from being generated from the wiring layers 51A, 51B, 52A, and 52B and the bonding layer 40 made into the films. As a result, the degree of vacuum in the vibration space of the resonance unit 1 can be suppressed from being reduced.

Preferably, the preparing of the lower substrate 50 further includes forming, in the resonator 10, the lower electrode E1, the upper electrode E2, and the piezoelectric film F3 located between the lower electrode E1 and the upper electrode E2. Preferably, the heating further includes forming the bonding layer 40 that seals the internal space between the lower substrate 50 and the upper substrate 30 by using the first metal layer 41 and the second metal layer 42.

Preferably, the vacuum vapor deposition condition is a condition in which evacuation is performed so that the degree of vacuum in a vacuum vapor deposition apparatus used for vapor deposition is set to be $1\times10^{-3}$ Pa or less. Preferably, the first component is Al, and the second component is Ge.

Each exemplary embodiment described above is for the sake of facilitating understanding the present invention and is not intended to limit an interpretation of the present invention. It should be appreciated that the present invention may be modified/improved without departing from the gist of the invention, and equivalents thereof are also included in the present invention. That is, embodiments that undergo appropriate design changes by those skilled in the art are included in the scope of the present invention as long as the characteristics of the present invention are provided. For example, constituent elements of the embodiments and their arrangements, materials, conditions, shapes, sizes, and the like are not limited to the exemplifications and may be appropriately changed. It is needless to say that each of the embodiments is an exemplification and that configurations shown in different embodiments may be partly replaced or combined with each other, and these are also included in the scope of the present invention as long as the characteristics of the present invention are provided.

REFERENCE SIGNS LIST 1 resonance unit
10 resonator
20 lower lid
30 upper lid
40 bonding layer
41 first layer
42 second layer
50 SOI substrate
51A first wiring layer
51B first wiring layer
52A second wiring layer
52B second wiring layer
110 holding arm
120 vibration portion
130 base portion
135 a plurality of vibration arms
140 holding portion

The invention claimed is:
1. A MEMS device comprising:
a lower substrate having a resonator that includes a lower electrode, an upper electrode, and a piezoelectric film disposed therebetween;
an upper substrate that opposes the resonator;
a bonding layer that seals an internal space between the lower substrate and the upper substrate; and
a wiring layer that contains a same metal material as the bonding layer,
wherein the wiring layer comprises a rare gas content that is less than $1\times10^{20}$ (atoms/cm$^3$),
wherein the wiring layer is disposed in the internal space and not directly coupled to the bonding layer,
wherein the wiring layer comprises a pair of wiring layers that electrically couples an external terminal to one of the lower electrode and the upper electrode of the resonator,
wherein a first wiring layer of the pair of wiring layers is offset in a thickness direction relative to a second wiring layer of the pair of wiring layers, such that a non-eutectic portion is provided in a region away from a contact area between the first and second wiring layers, and
wherein the thickness direction is measured in a directional normal to a surface of the piezoelectric film.
2. The MEMS device according to claim 1, wherein the external terminal is disposed on an external surface of the upper substrate.

3. The MEMS device according to claim 2, wherein the wiring layer is interposed between the upper and lower substrates and comprises a same film as the bonding layer.

4. The MEMS device according to claim 3, wherein the wiring layer is disposed closer to the resonator than the bonding layer in a plan view of the MEMS device.

5. The MEMS device according to claim 1, wherein the wiring layer includes an Al layer and a Ge layer.

6. The MEMS device according to claim 5, wherein the bonding layer bonds the lower substrate to the upper substrate by a eutectic reaction between an Al-containing layer and a Ge-containing layer.

7. The MEMS device according to claim 1, further comprising a getter layer disposed on a surface of the upper substrate that opposes the resonator, with the getter layer comprising a material configured to attract gas generated in the internal space between the lower substrate and the upper substrate.

8. The MEMS device according to claim 1, wherein the rare gas content comprises a gas that consists of one of argon, krypton, helium, neon, and xenon.

9. The MEMS device according to claim 1, wherein the wiring layer comprises a rare gas content that is more than 0 (atoms/cm$^3$).

10. A MEMS device comprising:
a lower substrate;
an upper substrate;
a bonding layer that seals an internal space between the lower substrate and the upper substrate;
a resonator disposed in the internal space between the upper and lower substrates and including a lower electrode, an upper electrode, and a piezoelectric film disposed therebetween; and
a wiring layer interposed in the internal space between the upper and lower substrates and comprising a same material as the bonding layer,
wherein the wiring layer comprises a rare gas content that is more than 0 (atoms/cm$^3$) and that is less than $1 \times 10^{20}$ (atoms/cm$^3$),
wherein the wiring layer is not directly coupled to the bonding layer, and
wherein the wiring layer comprises a pair of wiring layers that electrically couples an external terminal to one of the lower electrode and the upper electrode of the resonator,
wherein a first wiring layer of the pair of wiring layers is offset in a thickness direction relative to a second wiring layer of the pair of wiring layers, such that a non-eutectic portion is provided in a region away from a contact area between the first and second wiring layers, and
wherein the thickness direction is measured in a directional normal to a surface of the piezoelectric film.

11. The MEMS device according to claim 10, wherein the external terminal is disposed on an external surface of the upper substrate.

12. The MEMS device according to claim 10, wherein the wiring layer includes an Al layer and a Ge layer.

13. The MEMS device according to claim 12, wherein the bonding layer bonds the lower substrate to the upper substrate by a eutectic reaction between an Al-containing layer and a Ge-containing layer.

14. The MEMS device according to claim 10, further comprising a getter layer disposed on a surface of the upper substrate that opposes the resonator, with the getter layer comprising a material configured to attract gas generated in the internal space between the lower substrate and the upper substrate.

15. The MEMS device according to claim 10, wherein the rare gas content comprises a gas that consists of one of argon, krypton, helium, neon, and xenon.

* * * * *